United States Patent

Kataoka et al.

[11] Patent Number: 5,913,111
[45] Date of Patent: Jun. 15, 1999

[54] METHOD OF MANUFACTURING AN INSULAED GATE TRANSISTOR

[75] Inventors: Yuzo Kataoka, Hiratsuka; Shunsuke Inoue, Yokohama, both of Japan

[73] Assignee: Canon Kabushiki Kaisha, Tokyo, Japan

[21] Appl. No.: 08/587,661

[22] Filed: Jan. 17, 1996

[30] Foreign Application Priority Data

Jan. 18, 1995 [JP] Japan .................................. 7-005808
Nov. 30, 1995 [JP] Japan .................................. 7-312344

[51] Int. Cl.$^6$ ........................... H01L 21/00; H01L 21/84; H01L 21/22; H01L 21/38
[52] U.S. Cl. ........................... 438/163; 438/164; 438/564
[58] Field of Search ........................... 437/40 CS, 41 CS, 437/41 RLD, 160, 161, 162, 163, 164; 257/336; 438/300, 558, 564, 307, 157, 163, 279, 164

[56] References Cited

U.S. PATENT DOCUMENTS

| | | | |
|---|---|---|---|
| 3,887,993 | 6/1975 | Okada et al. | 437/160 |
| 4,069,067 | 1/1978 | Ichinoe | 438/564 |
| 4,072,545 | 2/1978 | De La Moneda | 438/300 |
| 4,341,009 | 7/1982 | Bartholomew et al. | 438/564 |
| 4,536,943 | 8/1985 | Kakumu | 438/307 |
| 4,731,318 | 3/1988 | Roche et al. | 438/307 |
| 4,945,070 | 7/1990 | Hsu | 437/160 |
| 4,992,389 | 2/1991 | Ogura et al. | 438/279 |
| 5,031,010 | 7/1991 | Mikata et al. | 257/346 |
| 5,200,352 | 4/1993 | Pfiester | 437/41 RLD |
| 5,200,639 | 4/1993 | Ishizuka et al. | 257/508 |
| 5,312,518 | 5/1994 | Kadumura | 156/662 |
| 5,389,557 | 2/1995 | Jung-Suk | 437/44 |
| 5,700,700 | 12/1997 | Hwang | 437/21 |
| 5,733,803 | 3/1998 | Mueller | 438/154 |

FOREIGN PATENT DOCUMENTS

| | | |
|---|---|---|
| 0 588 087 | 3/1994 | European Pat. Off. . |
| 1-94666 | 4/1989 | Japan . |

OTHER PUBLICATIONS

T. Hosoya, "A Self–Aligning Contact Process For MOS LSI", IEEE Transactions on Electron Devices, vol. ED–28, No. 1, Jan. 1981, pp. 77–82.

P. Ko, "SiGMOS–A Silicon Gigabit/S NMOS Technology", Int'l Electron Devices Meeting 1983, Tech. Dig., Washington DC, Dec. 5–7, 1983, pp. 751–753.

*Primary Examiner*—Brian Dutton
*Attorney, Agent, or Firm*—Fitzpatrick, Cella, Harper & Scinto

[57] ABSTRACT

This invention provides a transistor manufacture method comprising the steps of forming, on a semiconductor substrate, an insulating film being made open at least in an introducing portion through which an impurity for forming a drain region other than a lightly-doped region is introduced, then forming a gate electrode and a drain electrode each containing an impurity, and then introducing the impurity through between the gate electrode and the drain electrode to thereby form the lightly-doped region; and introducing the impurity from the drain electrode through the impurity introducing portion with heat treatment, to thereby form the drain region. A transistor manufactured by the above method is also provided.

7 Claims, 9 Drawing Sheets

FIG. I
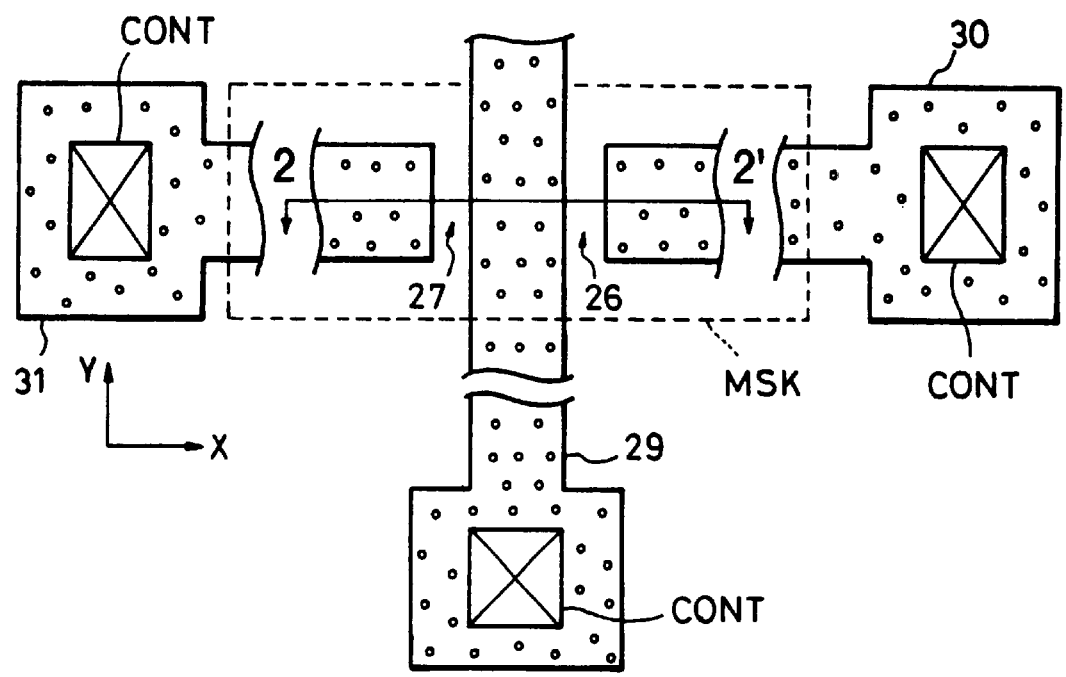
FIG. 2
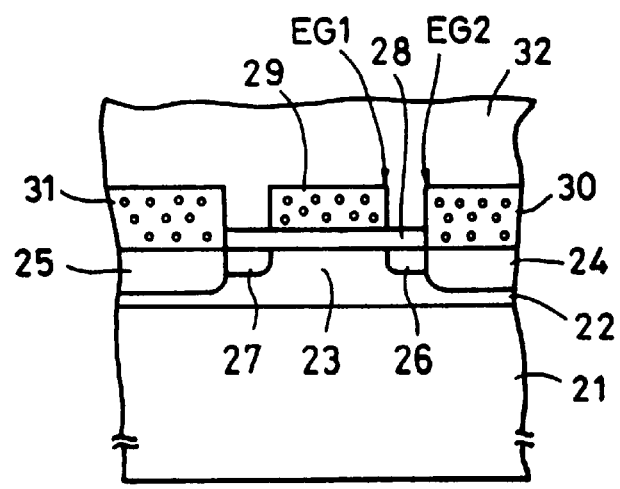

METHOD OF MANUFACTURING AN INSULAED GATE TRANSISTOR

BACKGROUND OF THE INVENTION

1. Field of the Invention

The present invention relates to a transistor having a lightly-doped-drain (hereinafter abbreviated as LDD) for use in integrated circuits such as liquid crystal devices and image sensors. The invention also relates to a manufacture method of the transistor.

2. Description of the Related Art

With an increasing degree of IC integration, the gate length of insulated gate transistors represented by MOS transistors has become shorter year by year and is now on the order of sub-microns.

Such a reduction in the gate length makes the gradient of an electric field at the drain edge so steep as to generate hot electrons. The generation of hot electrons deteriorates characteristics of MOS transistors. An LDD structure is proposed to solve the above problem. The LDD structure intends to reduce the impurity concentration at the drain edge to moderate the electric field at the drain edge, thereby preventing deterioration in characteristics of MOS transistors.

A conventional manufacture method of an LDD-MOS transistor will be described below with reference to FIGS. 26 to 30.

(1) After forming isolating regions 2 on a P-type semiconductor substrate 1, a gate oxide film 3 is formed 100 to 200 angstroms on an active region (FIG. 26).

(2) After forming a polycrystalline silicon on the substrate surface, an impurity is doped in the polycrystalline silicon film and is patterned by photolithography to form a gate electrode 4. Phosphorus, for example, is then doped in dose amount of 5E12 to 1E14 atoms/cm$^2$ ($5\times10^{12}$ to $1\times10^{14}$ atoms/cm$^2$) by ion implantation to form regions 8, 8' with the oxide films of the isolating regions 2 and the polycrystalline silicon of the gate electrode 4 used as a mask (FIG. 27).

(3) A SiO$_2$ film 9 is formed 2000 to 4000 angstroms on the substrate surface by the CVD process (FIG. 28).

(4) Side spacers 10, 10' are formed by etch-back on both sides of the polycrystalline silicon gate electrode 4 (FIG. 29).

(5) Arsenic (As), for example, is doped in dose amount of $5\times10^{15}$ to $1\times10^{16}$ atoms/cm$^2$ by ion implantation with the oxide films of the isolating regions 2, the polycrystalline silicon of the gate electrode 4 and the side spacers 10, 10' used as a mask. Then, the ion-implanted impurity is activated by heat treatment to form drain/source regions 11, 11' (FIG. 30). At this time, parts of the regions 8, 8' are left as drain/source regions 12, 12'.

An nMOS transistor of the LDD structure is fabricated through the manufacture process explained above In the transistor of FIG. 30, the drain 12 is formed with lower impurity concentration than the drain 11. As a result, an electric field at the drain end is moderated.

However, the above prior art has the following problem. Due to variations in the size of the side spacers 10, 10' formed by etch-back of the SiO$_2$ film deposited using the CVD process, the region of the lightly-doped drain 12 is also varied in size. Such a change in the length of the lightly-doped region varies transconductance (gm) of the MOS transistor and hence impedes achievement of stable MOS characteristics.

It has been difficult to precisely control the size of the side spacers 10, 10' for the reason below. Generally, a thickness of the SiO$_2$ film 9 is varied about 5 to 10 % in the wafer plane. Then, the size of the side spacers 10, 10' is determined depending on the thickness of the SiO$_2$ film 9. Accordingly, variations in the thickness of the SiO$_2$ film 9 directly affect variations in the size of the side spacers 10, 10'.

SUMMARY OF THE INVENTION

An object of the present invention is to solve the above-stated problem in the prior art and to improve dimensional accuracy of a lightly-doped region in an LDD-structure transistor.

The present invention resides in an insulated gate transistor comprising a channel region of first conductivity type and a drain region which includes a first semiconductor region of second conductivity type and a second semiconductor region of the second conductivity type being in contact with the first semiconductor region and having lower impurity concentration than the first semiconductor region, wherein a gate electrode and a drain electrode provided and the second semiconductor region are self-aligned with each other.

Also, the present invention resides in a manufacture method of an insulated gate transistor comprising a channel region of first conductivity type and a drain region which includes a first semiconductor region of second conductivity type and a second semiconductor region of the second conductivity type being in contact with the first semiconductor region and having lower impurity concentration than the first semiconductor region, wherein the method comprises the steps of:

forming, on a semiconductor substrate, an insulating film being made open at least in an introducing portion through which an impurity for forming the first semiconductor region is introduced, then forming a gate electrode and a drain electrode each formed of a conductive layer containing an impurity of the second conductivity type, and then introducing the impurity of the second conductivity type through between the gate electrode and the drain electrode to thereby form the second semiconductor region, and introducing the impurity of the second conductivity type from the conductive layer serving as the drain electrode through the impurity introducing portion with heat treatment, to thereby form the first semiconductor region.

BRIEF DESCRIPTION OF THE DRAWINGS

FIG. 1 is a schematic plan view showing one embodiment of a transistor according to the present invention.

FIG. 2 is a sectional view taken along the line 2—2' FIG. 1.

DETAILED DESCRIPTION OF THE PREFERRED EMBODIMENTS

Figure 3:
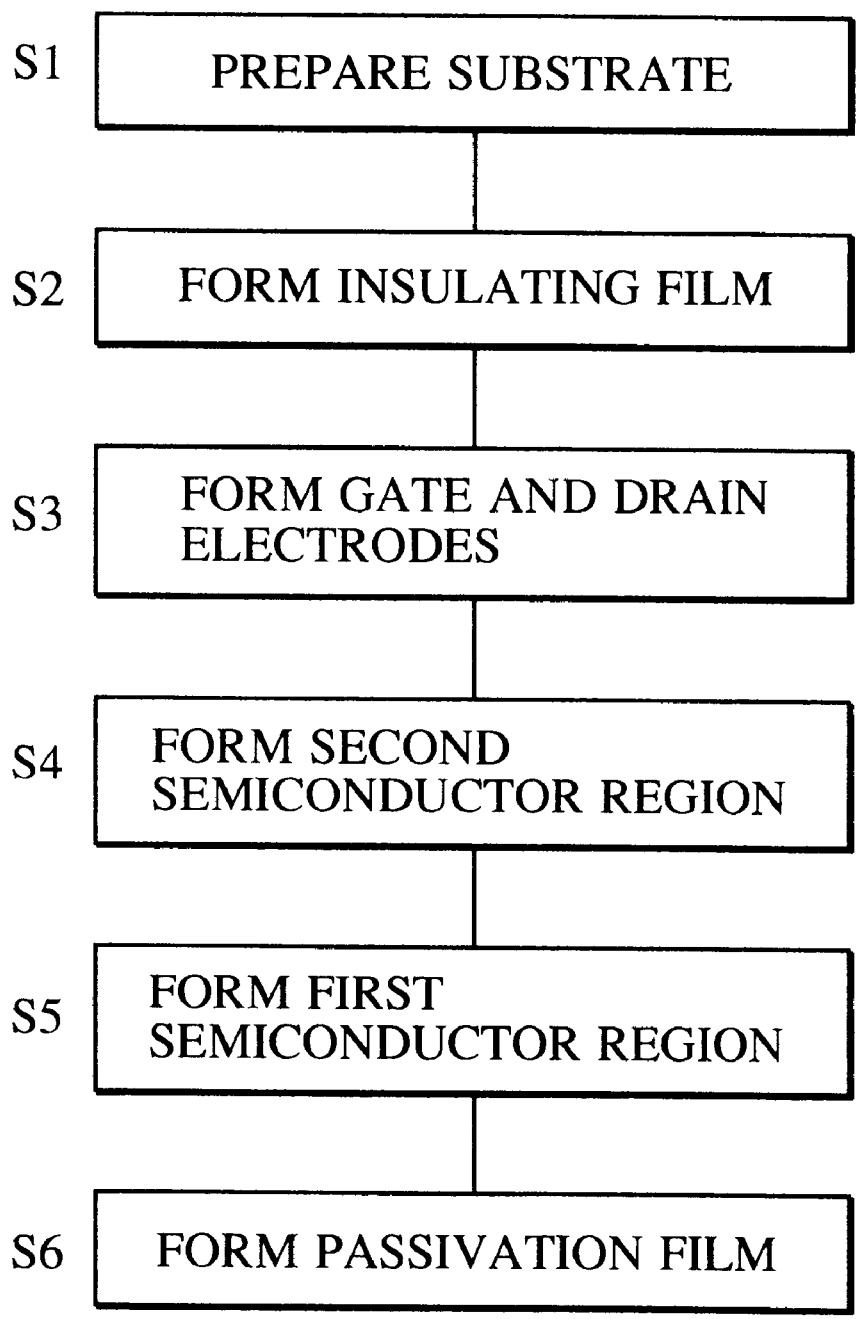
FIG. 3 is a flowchart showing a manufacture process of the transistor according to the present invention.

FIG. 1 is a schematic plan view showing a transistor according to one preferred embodiment of the present invention and FIG. 2 is a sectional view taken along the line 2—2' in FIG. 1.

In the figures, denoted by reference numeral 21 is a substrate, 22 is a semiconductor body having a channel region 23, 24 is a first semiconductor region having high impurity concentration which serves as a drain, and 26 is a second semiconductor region having low impurity concentration which also serves as a drain.

Denoted by 25, 27 are sources which are formed, as needed, in a like manner to the drains.

Denoted by 28 is a gate insulating film, 29 is a gate electrode, 30 is a drain electrode, and 31 is a source electrode.

Denoted by 32 is a passivation film.

Additionally, CONT in FIG. 1 denotes a contact hole provided, as needed, for each of the electrodes.

As will be seen from FIG. 2, a drain side edge portion EG1 of the gate electrode 29 and a gate side edge portion EG2 of the drain electrode 30 are self-aligned respectively with opposite edge portions of the second semiconductor region 26.

While the corresponding edge portions are shown as perfectly aligning with each other in FIG. 2, there may occur a slight shift between the edge portions due to lateral diffusion of the impurity and oxidation of the gate or drain electrode, because an actual manufacture process often includes heat treatment in which heat is applied to the transistor. Such a shift between the edge portions is on the order of sub-microns or several nanometers, and transistors having shifts on that order are also involved in the present invention.

FIG. 3 is a flowchart showing one embodiment of a manufacture process of the transistor according to the present invention.

The following description will be made by referring to FIGS. 1 and 2 and FIG. 3 in a correspondent manner.

First, the substrate 21 is prepared. The substrate 21 includes the semiconductor body 22. (Step S1). Next, the insulating film 28 is formed on the semiconductor body 22. The insulating film 28 has an opening in a position where the drain electrode 30 is to be formed, and the semiconductor body is exposed in the opening. (Step S2)

Subsequently, the gate electrode 29 and the drain electrode 30 are formed. (Step S3)

Then, an impurity is doped to form the second semiconductor region 26. (Step S4) At this time, the impurity is selected so that the second semiconductor region 26 and the channel region 23 have opposite conductivity types. If the channel region 23 has P-type conductivity, the impurity is selected so as to become a donor. Conversely, if it has N-type conductivity, the impurity is selected so as to become an acceptor.

In Step S5, the first semiconductor region 24 is formed. After that, the passivation film is formed as needed. (Step S6).

The substrate 21 used in the present invention is preferably formed of a semiconductor or insulator. For a semiconductor, it is advantageous to employ a single crystal wafer which is in unitary structure with the semiconductor body 22. For an insulator, an SOI base plate is advantageously employed.

The drains 24, 26 are formed of a semiconductor having the opposite conductivity to that of the channel region 23 and are designed so that the first semiconductor region 24 has higher impurity concentration than the second semiconductor region 26. Thus, for a P-channel transistor, the drains 24, 26 have P-type conductivity and the channel region 23 has N-type conductivity On the other hand, for an N-channel transistor, the drains 24, 26 have N-type conductivity.

The insulating film 28 under the gate electrode 29 includes a portion which functions as a gate insulating film The insulating film is preferably formed of an oxide film, a nitride film or the like.

The gate electrode 29 is made of a metal such as aluminum (Al), chromium (Cr), molybdenum (Mo), tantalum (Ta), platinum (Pt), tungsten (W), titanium (Ti) and copper (Cu), an alloy of two or more selected from among those metals, an alloy containing any of those metals as a main ingredient and other element (such as Si), or a semiconductor doped with an impurity of high concentration. However, it is necessary to select a suitable material having an optimum work function in view of required transistor characteristics. In many cases, polycrystalline silicon as a doped semiconductor is advantageously employed.

The drain electrode 30 is made of a material having an impurity to be doped into the first semiconductor region 24. In many cases, polycrystalline silicon containing an impurity is advantageously employed.

The passivation film 32 which is formed, as needed, is made of an inorganic insulator such as silicon oxide and silicon nitride, or an organic insulator such as polyimide, polyamide, epoxy and silicone resin.

Step S1 is carried out as, for example, a step of depositing the body 22 on a wafer through epitaxial growth, a step of forming a polycrystalline semiconductor on a quartz base plate, or a step of growing single crystal silicon on a sapphire base plate In the case of using an SOI base plate, Step S1 includes solid or liquid phase growth of polycrystalline silicon with laser annealing or heat treatment.

Step S2 is carried out by thermal oxidation or vapor phase deposition. Step S2 also includes a step of forming an opening by etching after deposition of the insulating film, or a step of forming a patterned insulating film while masking part of the body 22 which will be an opening.

Step S3 includes steps of depositing a conductor (including a heavily-doped semiconductor) for the gate electrode and the drain electrode, and patterning a deposited conductor film by etching, or steps of masking a predetermined region and selectively depositing a conductor in a region other than the masked region, as with the lift-off process.

The gate electrode and the drain electrode may be formed separately in different steps. In the present invention, however, the gate and drain electrodes are preferably formed by depositing a material common to both the electrodes and patterning the deposited material by photolithography. An exposure apparatus used for photolithography in that case may be of an excimer laser emitting a beam of light having wavelength of at least one selected from among 157 nm, 193 nm, 222 nm, 248 nm, 284 nm, 308 nm, 342 nm, 351 nm and 353 nm, or a stepper utilizing ultraviolet rays (i-rays). Particularly, excimer laser exposure is suitable for the present invention in point of further improving the patterning accuracy.

In Step S4, the second semiconductor region 26 is preferably formed by implanting impurity ions, i.e., ion implantation, with the gate and drain electrodes used as a mask. Incidentally, the active region, etc. which do not require high accuracy may be masked by using a resist as mask material, if necessary, as indicated by MSK in FIG. 1.

When a thick field insulating film formed by selective oxidation serves as the mask material to define the active region, a resist is not required for making the active region.

It is preferable that heat treatment be carried out, as needed, after the ion implantation. At this time, it is more preferable to add a step of oxidizing the gate and drain electrodes so that the space between both the electrodes (above the second semiconductor region 26) is filled with an insulator. Shifts in position of the edge portions EG1, EG2 in such a case are advantageously estimated beforehand by simulation.

Step S5 includes a step of diffusing the impurity from the drain electrode into the underlying body with heat treatment.

Step S6 includes a step of thermal oxidation or vapor phase deposition. The vapor phase deposition can be performed by sputtering or CVD. In the case of using an organic insulator, Step S6 is carried out by spin coating or printing.

The impurity used in the present invention is given by an element of Group V of the Periodic Table, such as phosphorus (P) and arsenic (As), or an element of Group III of the Periodic Table, such as boron (B) and aluminum (Al).

When a semiconductor other than silicon is used as the body 22, an element suitable for the used semiconductor is employed case by case. These combinations between semiconductors and impurities are well known in the art.

Further, if a liquid crystal panel is formed by placing a liquid crystal between a substrate including the transistors manufactured according to the present invention and a transparent plate such as a glass base plate, a good liquid crystal device of TFT active matrix type can be provided.

In that case, it is advantageous to employ the transistors of the present invention as transistors disposed at intersects between matrix electrodes, and in at least part of a peripheral driving circuit for transmitting a video signal to signal lines.

It is also advantageous that P-channel transistors and N-channel transistors, in which semiconductors have opposite conductivity types to each other, are arranged on a common substrate in mixed fashion.

Examples of the present invention will be described below. It should be understood that the present invention is not limited to the following examples, but involves alternatives and equivalents which are replaced by components of the invention without departing from the scope to achieve the object of the invention.

Examples of the present invention will now be described in detail with reference to the drawings.

(First Example)

FIGS. 4 to 8 are sectional views showing a first example of the manufacture method of the insulated gate transistor according to the present invention. These figures show best features of the present invention. A description will now be made on manufacture steps of this Example with reference to FIGS. 4 to 8.

Figure 4:
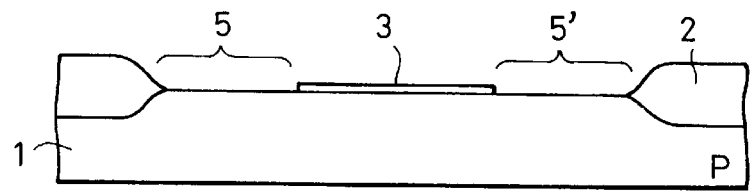
FIG. 4 is a sectional view showing a manufacture step of an LDD-MOS transistor according to a first example of the present invention.

(1) A semiconductor substrate 1 of P-type single crystal silicon, for example, is prepared and isolating regions 2 of thick silicon oxide are formed thereon by selective oxidation. A gate oxide film 3 of thin silicon oxide is then formed 100 to 200 angstroms in an active region surrounded by the isolating regions 2. After that, part of the gate oxide film is etched away by photolithography to form openings, i.e., regions 5, 5' where a source and a drain as main electrode regions are to be formed (FIG. 4).

Figure 5:
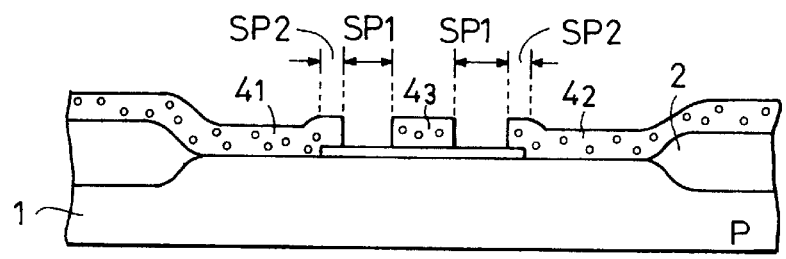
FIG. 5 is a sectional view showing a manufacture step of the LDD-MOS transistor according to the first example of the present invention.

(2) Next, a polycrystalline silicon film is formed 2000 to 4000 angstroms on the substrate surface, and phosphorus (P) as an N-type impurity is doped into the polycrystalline silicon film by ion implantation or diffusion. Subsequently, drain, source and gate electrodes $4_1$, $4_2$, $4_3$ of polycrystalline silicon are formed by patterning (FIG. 5). At this time, a gap SP1 between the gate electrode $4_3$ and the drain or source electrode $4_1$, $4_2$ is selected to be about 0.2 to 0.5 μm. An overlapping length SP2 between the gate oxide film 3 and the polycrystalline silicon of the drain or source electrode $4_1$, $4_2$ is selected to be about 0.1 to 0.3 μm.

Figure 6:
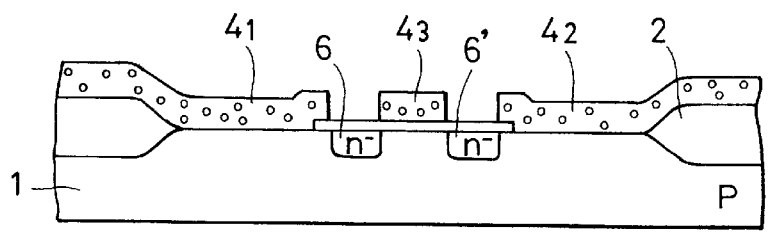
FIG. 6 is a sectional view showing a manufacture step of the LDD-MOS transistor according to the first example of the present invention.

(3) Phosphorus (P), for example, is doped in dose amount of $5 \times 10^{12}$ to $1 \times 10^{14}$ atoms/cm$^2$ by ion implantation to form n$^-$-type lightly-doped regions 6, 6' with the polycrystalline silicon used as a mask (FIG. 6).

Figure 7:
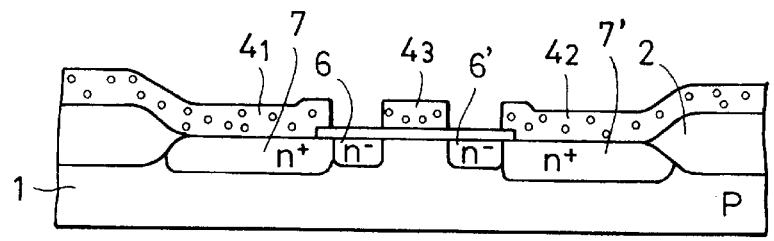
FIG. 7 is a sectional view showing a manufacture step of the LDD-MOS transistor according to the first example of the present invention.

(4) n$^+$-Type main drain and source regions 7, 7' are formed by diffusing the impurity in the polycrystalline silicon forming the drain the source electrode $4_1$, $4_2$ into the semiconductor substrate 1 with heat treatment (FIG. 7).

Figure 8:
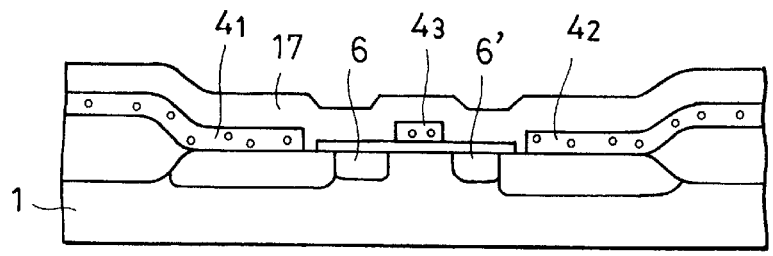
FIG. 8 is a sectional view showing a manufacture step of the LDD-MOS transistor according to the first example of the present invention.

(5) In the step of heat treatment, alternatively, the main drain and source regions are heat-treated under oxidation atmosphere to oxidize upper and lateral surface of the polycrystalline silicon. As a result, the edge portions of the polycrystalline silicon recede. Assuming that the length of each of the n-type lightly-doped regions 6, 6', i.e., the length of the gap SP1, is a and the thickness of an oxide film 17 is b, the oxide film (insulating film) 17 is formed over not only the insulating films between the gate electrode $4_3$ and the drain and source electrodes $4_1$, $4_2$, but also the polycrystalline silicon (electrodes $4_1$, $4_2$, $4_3$) by depositing the film on condition of $2b > a$ (FIG. 8).

The LDD-MOS transistor manufactured through the above steps exhibits good controllability because the lightly-doped regions are each formed in a self-aligned manner with the aid of the gate electrode and the drain or source electrode.

(Second Example)

FIGS. 9 to 13 are sectional views showing a second example of the manufacture method of the insulated gate transistor according to the present invention A description will now be made on manufacture steps of this Example with reference to FIGS. 4 to 8.

Figure 9:
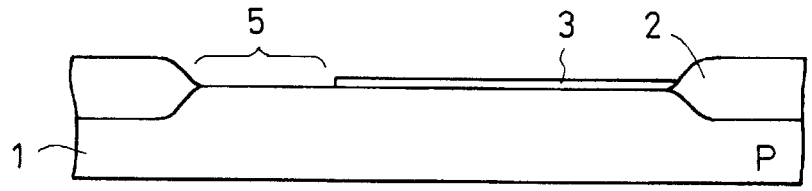
FIG. 9 is a sectional view showing a manufacture step of an LDD-MOS transistor according to a second example of the present invention.

(a) On a semiconductor substrate 1 of P-type single crystal silicon, for example, isolating regions 2 of silicon oxide are formed by selective oxidation A gate oxide film 3 of silicon oxide is then formed in a region where the transistor is to be formed. After that, part of the gate oxide film is etched away to form an opening, i.e., a region 5 where a drain as a main electrode region is to be formed (FIG. 9).

Figure 10:
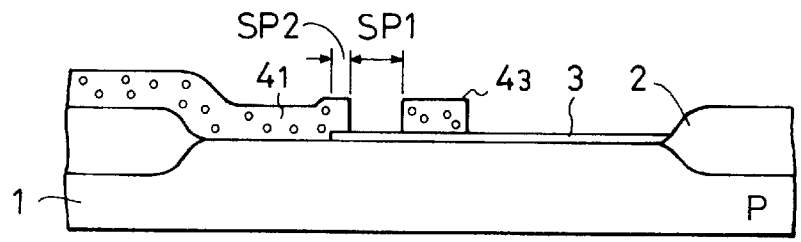
FIG. 10 is a sectional view showing a manufacture step of the LDD-MOS transistor according to the second example of the present invention.

(b) A polycrystalline silicon film is formed on the substrate surface, and an N-type impurity having the opposite conductivity type to that of the semiconductor substrate 1 is doped into the polycrystalline silicon film. Subsequently, a gate electrodes $4_3$ and a drain electrode and wiring $4_1$ are formed by patterning the polycrystalline silicon (FIG. 10). The gate electrodes $4_3$ is formed on the gate oxide film 3, while the drain electrode and wiring $4_1$ are formed so as to cover the opening of the gate oxide film 3 and overlap with the gate oxide film 3. An overlapping length SP2 therebetween is selected to be not less than 0.1 μm but not larger than 0.3 μm. Also, a gap SP1 between the polycrystalline silicon of the drain electrode $4_1$ and the polycrystalline silicon of the gate electrode $4_3$ is selected to be not less than 0.2 μm but not larger than 0.5 μm.

Figure 11:
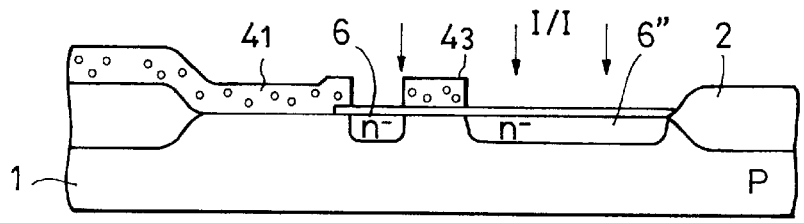
FIG. 11 is a sectional view showing a manufacture step of the LDD-MOS transistor according to the second example of the present invention.

(c) Next, phosphorus as an impurity having the opposite conductivity type to that of the semiconductor substrate 1 is implanted by ion implantation in portions where a lightly-doped region and a source region are to be formed, thereby forming a lightly-doped region 6 and a source region 6" (FIG. 11). At this time, the ion implantation may be made into only the lightly-doped region 6 through resist patterning.

Figure 12:
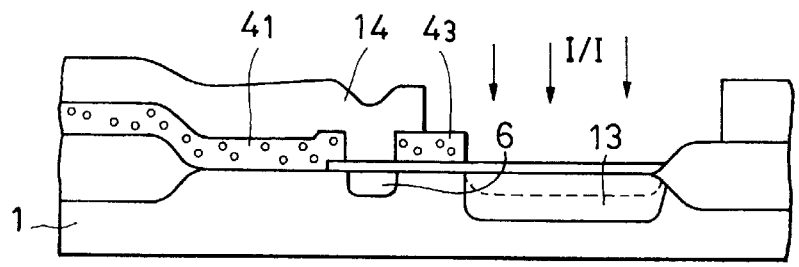
FIG. 12 is a sectional view showing a manufacture step of the LDD-MOS transistor according to the second example of the present invention.

(d) A resist 14 is coated so as to cover the substrate surface through resist patterning except the portion forming the source region, and phosphorus as an impurity having the opposite conductivity type to that of the semiconductor substrate 1 is implanted by ion implantation to form a source region 13 (FIG. 12).

(e) After removing the resist 14, a silicon oxide film 15 containing phosphorus and boron, as an interlayer insulating film, is formed by CVD under normal atmospheric pressure and then heat-treated in inert gas at high temperature of 800 to 1000° C. With the heat treatment, a drain region 7 forming a main drain layer is formed by diffusion of the impurity from the polycrystalline silicon film $4_1$ and, at the same, the regions 6, 13 formed by the ion implantation are activated.

Next, the film 15 is partly etched away through patterning in regions where an electrode for the source region is to be formed and the polycrystalline silicon wiring is to be connected to an upper wiring, thereby forming openings in those regions.

Figure 13:
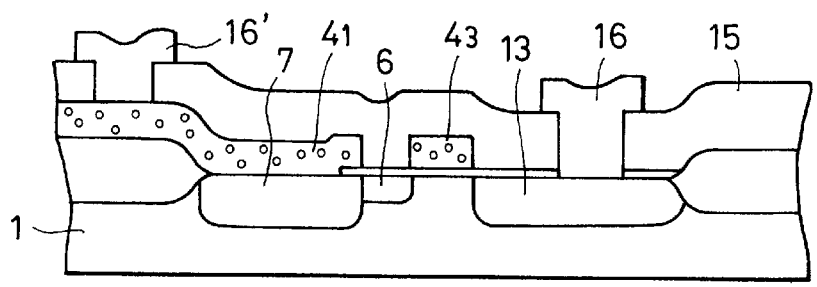
FIG. 13 is a sectional view showing a manufacture step of the LDD-MOS transistor according to the second example of the present invention.

After that, a wiring material primarily consisted of Al is formed by sputtering and then patterned to form wirings 16, 16', thereby completing an LDD-MOS transistor (FIG. 13).

The LDD-MOS transistor manufactured through the above steps exhibits good controllability because the lightly-doped region is formed in a self-aligned manner with the aid of the gate electrode and the drain electrode.

(Third Example)

FIGS. 14 to 19 are sectional views showing a third example of the manufacture method of the insulated gate transistor according to the present invention. This Example intends to form a thin film transistor (hereinafter referred to as TFT) by utilizing the present invention.

A description will now be made on manufacture steps of this Example with reference to FIGS. 14 to 19.

Figure 14:
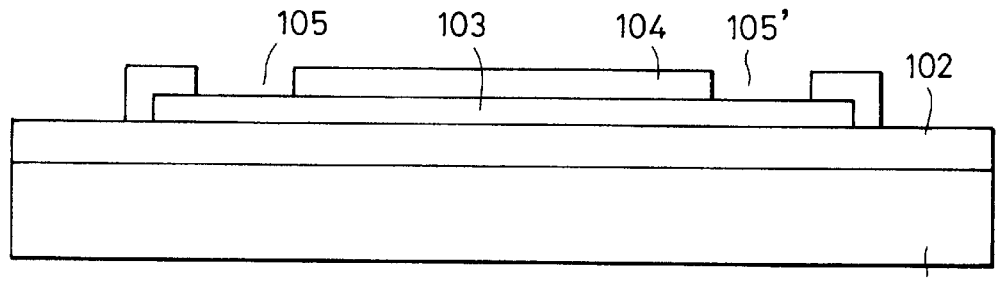
FIG. 14 is a sectional view showing a manufacture step of an LDD-MOS transistor according to a third example of the present invention.

(a) A silicon substrate 101 is subjected to thermal oxidation to grow a silicon oxide film of 0.1 to 1.0 μm. A polycrystalline silicon film 103 is deposited 100 to 1500 angstroms thereon by CVD. A gate insulating film 104 of silicon oxide is then grown 100 to 2000 angstroms by thermal oxidation. After that, parts of the gate oxide film are etched away by photolithography to form openings, i.e., regions 105, 105' where a source and a drain as main electrode regions are to be formed (FIG. 14).

Figure 15:
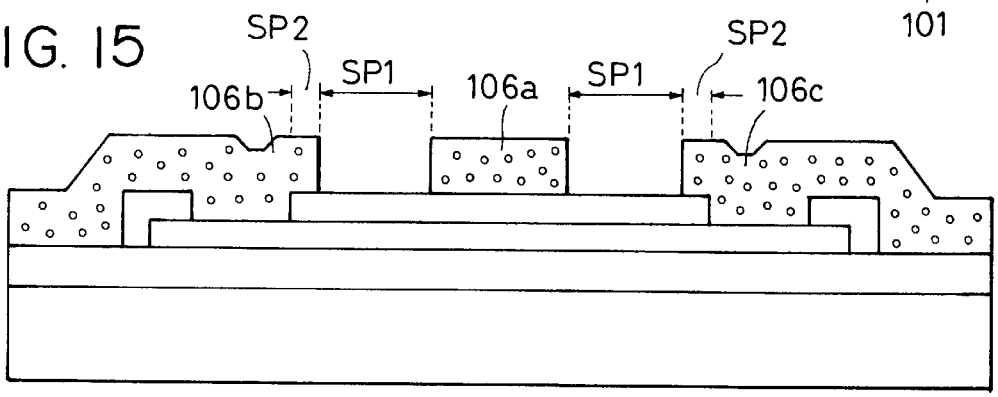
FIG. 15 is a sectional view showing a manufacture step of the LDD-MOS transistor according to the third example of the present invention.

(b) Next, a polycrystalline silicon film is formed 2000 to 4000 angstroms on the substrate surface, and phosphorus as an N-type impurity is doped into the polycrystalline silicon film by ion implantation or diffusion. Subsequently, drain, gate and source electrodes 106b, 106a, 106c of polycrystalline silicon are formed by patterning (FIG. 15). At this time, a gap SP1 between the gate electrode 106a and the drain or source electrode 106b, 106c is selected to be about 0.2 to 4.0 μm. An overlapping length SP2 between the gate oxide film 104 and the polycrystalline silicon of the drain or source electrode 106b, 106c is selected to be about 0.1 to 0.3 μm.

Figure 16:
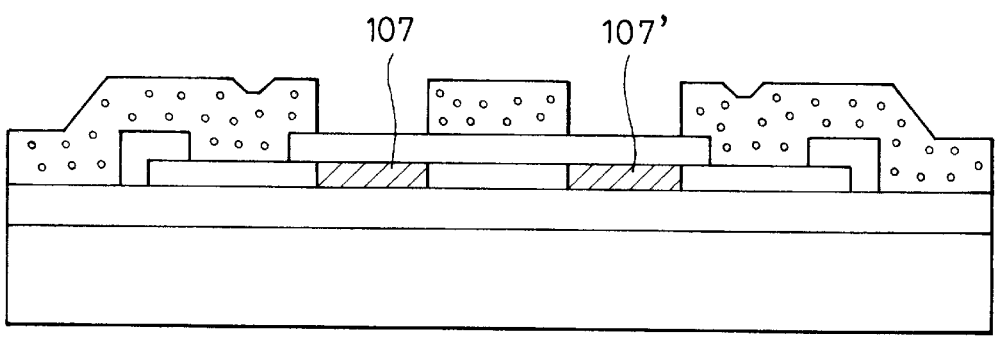
FIG. 16 is a sectional view showing a manufacture step of the LDD-MOS transistor according to the third example of the present invention.

(c) Phosphorus, for example, is doped in dose amount of $10^{12}$ to $10^{14}$ atoms/cm$^2$ by ion implantation to form lightly-doped regions 107, 107' with the polycrystalline silicon of the drain, gate and source electrodes used as a mask (FIG. 16).

Figure 17:
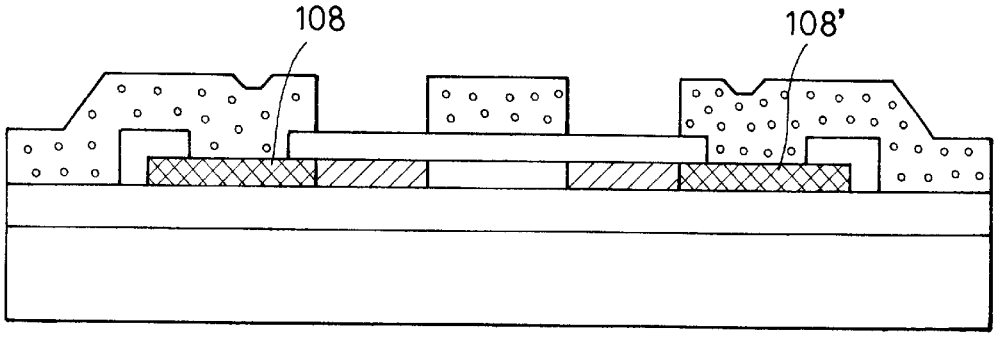
FIG. 17 is a sectional view showing a manufacture step of the LDD-MOS transistor according to the third example of the present invention.

(d) Main drain and source regions 108, 108' are formed by diffusing the impurity in the polycrystalline silicon forming the drain the source electrode into the polycrystalline silicon 103 with heat treatment (FIG. 17).

Figure 18:
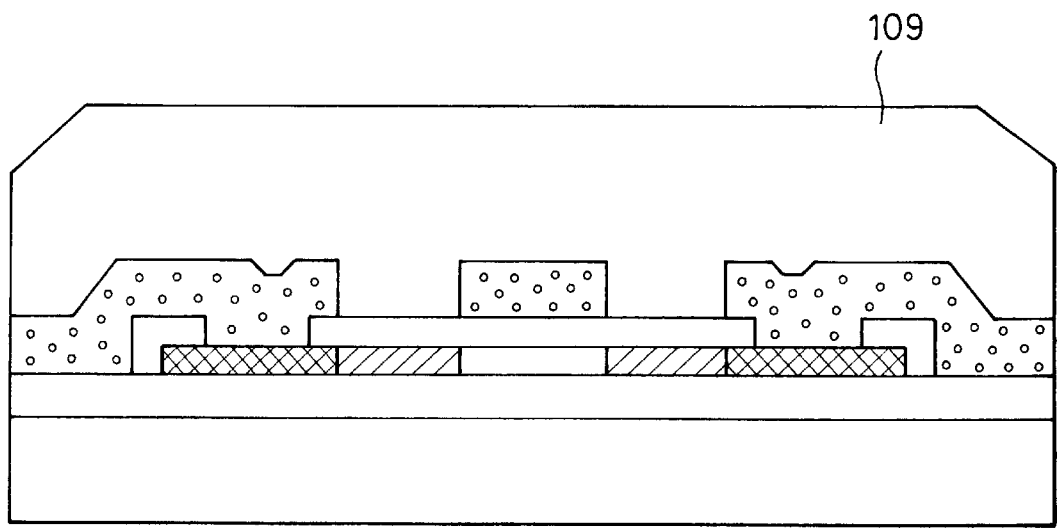
FIG. 18 is a sectional view showing a manufacture step of the LDD-MOS transistor according to the third example of the present invention.
Figure 19:
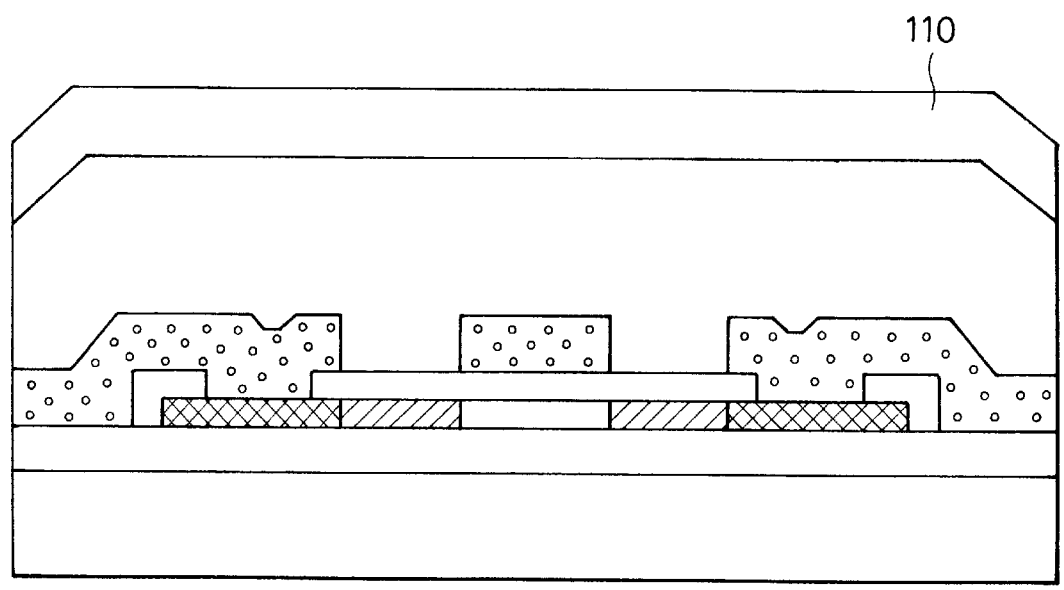
FIG. 19 is a sectional view showing a manufacture step of the LDD-MOS transistor according to the third example of the present invention.
Figure 20:
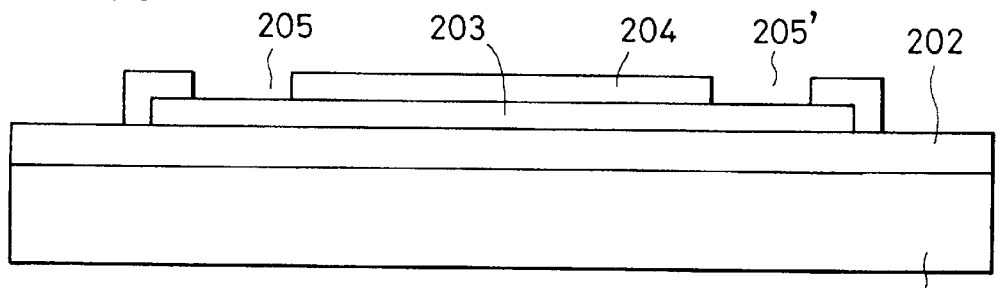
FIG. 20 is a sectional view showing a manufacture step of an LDD-MOS transistor according to a fourth example of the present invention.
Figure 21:
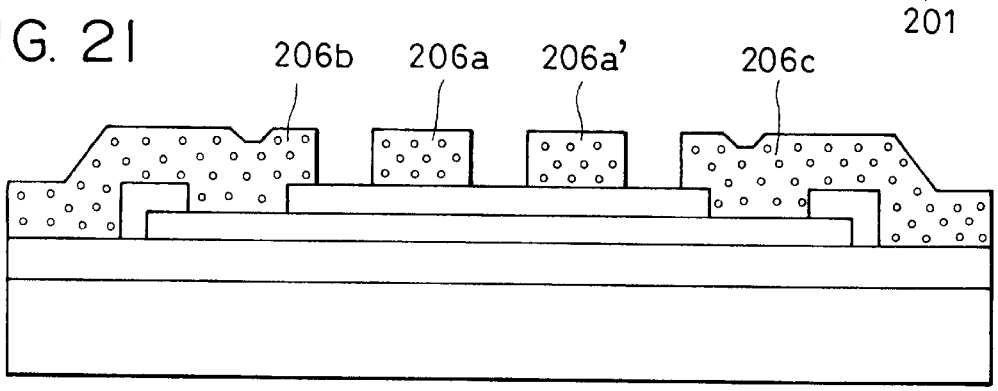
FIG. 21 is a sectional view showing a manufacture step of the LDD-MOS transistor according to the fourth example of the present invention.

(e) A silicon oxide film 109 is deposited on the surface by CVD (FIG. 18).

(f) After that, contact holes for connecting the source and drain electrodes of polycrystalline silicon to wiring electrodes of aluminum or an aluminum alloy may be formed by etching. In this case, aluminum is thereafter deposited and patterned to form wiring layers. These wiring layers are not illustrated (g) Next, a silicon nitride film 110 is deposited by plasma CVD (FIG. 19) and then heat-treated in $H_2$ gas or $H_2/N_2$ gas mixture at 300 to 475° C. for 30 to 180 minutes, thereby diffusing hydrogen atoms in the silicon nitride film into the polycrystalline silicon film 103 for hydrogenation. As a result, a stable TFT having a superior current driving capability can be formed.

The LDD type TFT manufactured through the above steps has advantages that a leak current, particularly when the TFT is in a non-conducted state, is not affected by misalignment possibly occurred in the photolithography process and is stably produced with good reproducibility, because the size of the lightly-doped regions can be determined in a self-aligned manner.

When the TFT is employed as a bidirectional switch, almost the same characteristics are obtained even after the drain and the source are replaced by each other. This is preferable from the viewpoint of circuit design.

In this Example, the silicon substrate 101 having the silicon oxide film 102 on its surface may be replaced by a glass or quartz base plate. For a glass base plate, it is desired to carry out the subsequent heat treatment at temperature not higher than 600° C.

Also, the polycrystalline silicon film 103 may be formed by solid phase epitaxy of amorphous silicon deposited by CVD, or by re-crystallization of the amorphous silicon using a laser.

The gate oxide film 104 can also be formed by CVD or sputtering other than thermal oxidation. A silicon nitride film may be used instead of the oxide film.

It is needless to say that this Example is applicable to a p-channel TFT as well by using ions all of which have P-type conductivity (Fourth Example)

FIGS. 20 to 25 are sectional views showing a fourth example of the manufacture method of the insulated gate transistor according to the present invention. In this Example, the present invention is applied to the manufacture process of a TFT as with the above third Example.

This Example relates to the manufacture process of a TFT having a "dual gate" structure wherein a gate electrode at the same potential is divided into two parts in the direction of channel length so that a leak current through the TFT in an off-state can be reduced and the yield of transistors can be improved.

Figure 22:
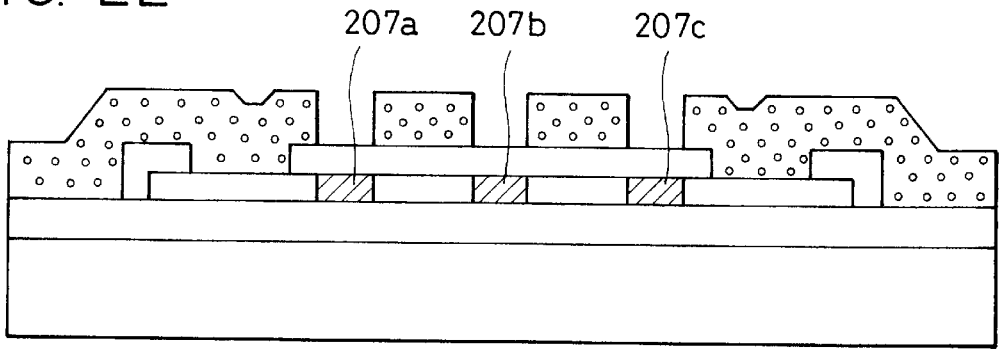
FIG. 22 is a sectional view showing a manufacture step of the LDD-MOS transistor according to the fourth example of the present invention.
Figure 23:
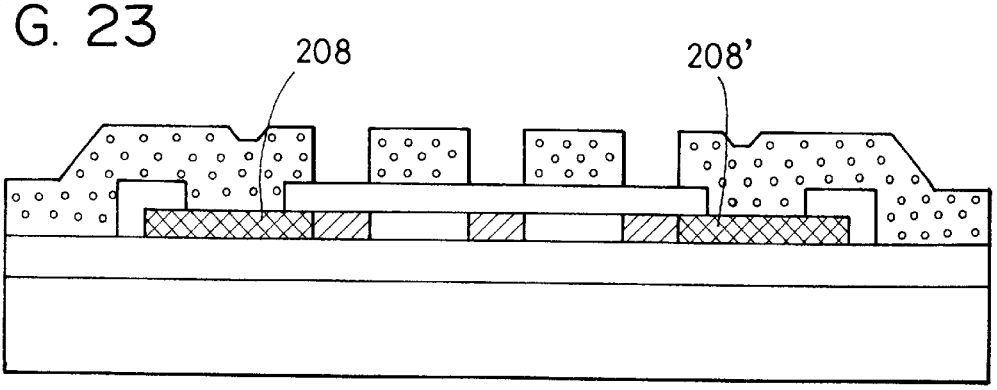
FIG. 23 is a sectional view showing a manufacture step of the LDD-MOS transistor according to the fourth example of the present invention.
Figure 24:
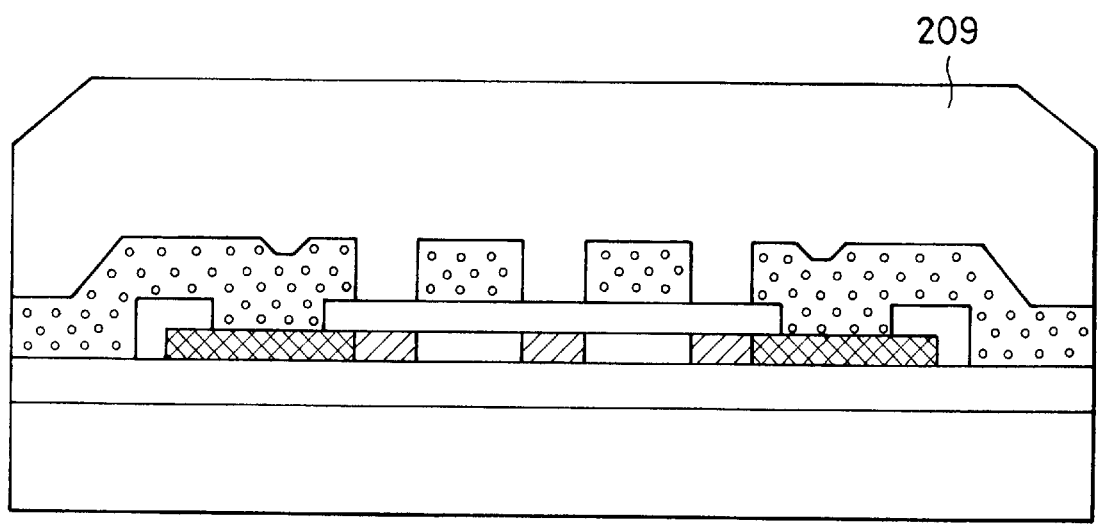
FIG. 24 is a sectional view showing a manufacture step of the LDD-MOS transistor according to the fourth example of the present invention.
Figure 25:
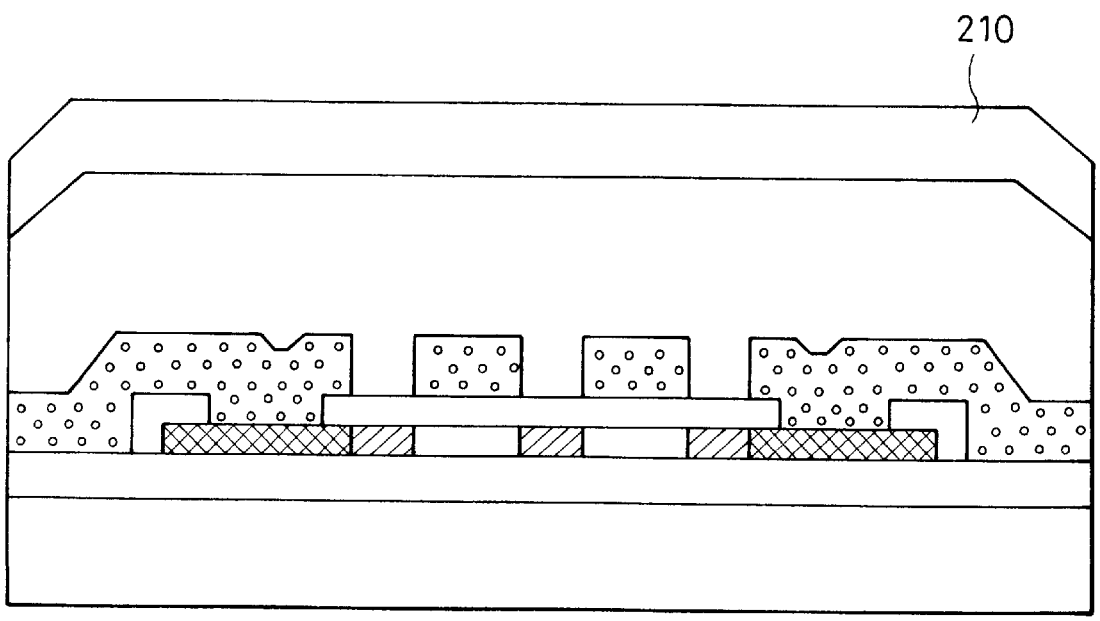
FIG. 25 is a sectional view showing a manufacture step of the LDD-MOS transistor according to the fourth example of the present invention.
Figure 26:
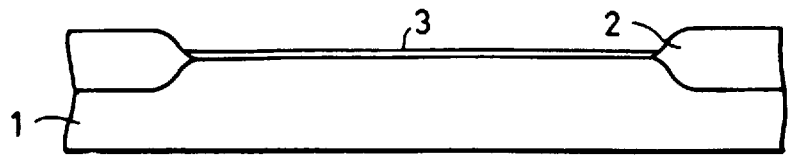
FIG. 26 is a sectional view showing a manufacture step of a conventional LDD-MOS transistor.
Figure 27:
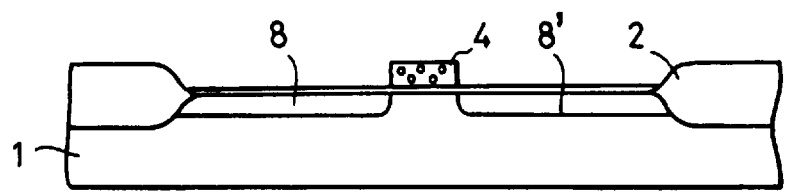
FIG. 27 is a sectional view showing a manufacture step of the conventional LDD-MOS transistor.
Figure 28:
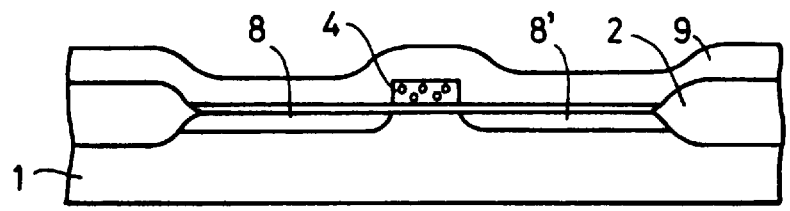
FIG. 28 is a sectional view showing a manufacture step of the conventional LDD-MOS transistor.
Figure 29:
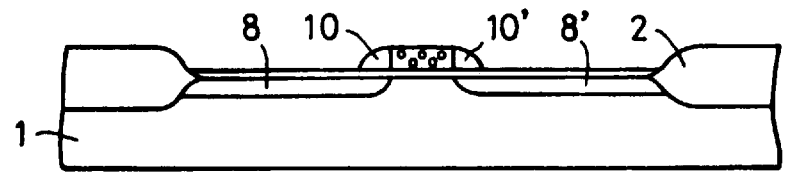
FIG. 29 is a sectional view showing a manufacture step of the conventional LDD-MOS transistor.
Figure 30:
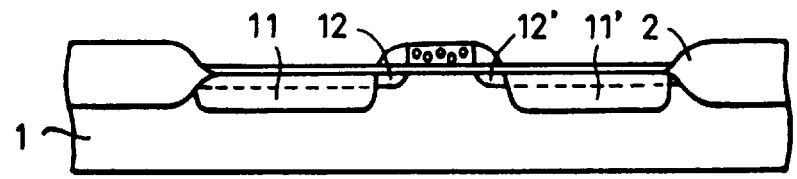
FIG. 30 is a sectional view showing a manufacture step of the conventional LDD-MOS transistor.

The TFT of this Example can be manufactured by employing exactly the same steps as in the above third Example. Because of the specific structure of the TFT, however, the gate electrode of polycrystalline silicon is divided into two portions 206a, 206a' (FIG. 21), and lightly-doped layers are formed not only in regions 207a, 207c respectively contacting the main drain and source regions, but also in a region 207b between the two gate electrodes (FIG. 22).

With this Example, since all of the lightly-doped layers 207a, 207b, 207c can be stably manufactured without being affected by misalignment possibly occurred in the photolithography process, characteristics of the TFT such as reproducibility and symmetry (agreement in characteristics when the source and the drain are replaced by each other) are ensured. This contributes to an improvement in characteristics of a liquid crystal panel, a heater head as an ink jet printer heat, and so on.

According to the present invention, as described above, since spaces created upon patterning a conductive layer such as a polycrystalline silicon layer are utilized to define lightly-doped regions, it is possible to precisely control the lightly-doped regions and stabilize transistor characteristics.

What is claimed is:

1. A method of manufacturing an insulated gate transistor comprising a channel region of a first conductivity type and a drain region which includes a first semiconductor region of a second conductivity type and a second semiconductor region of a second conductivity type being in contact with said first semiconductor region and having a lower impurity concentration than said first semiconductor region, the method comprising the steps of:

forming, on a semiconductor body on an insulator, an insulating film having openings at least at an introducing portion through which an impurity for forming said first semiconductor region is introduced, forming a gate electrode and a drain electrode, each formed by depositing a conductive layer containing an impurity of the second conductivity type, then patterning the deposited conductive layer by etching to form gaps, introducing said impurity of the second conductivity type through said gaps between said gate electrode and said drain electrode to thereby form said second semiconductor region, and introducing said impurity of the second conductivity type from said conductive layer serving as said drain electrode through said impurity introducing portion with heat treatment, to thereby form said first semiconductor region.

2. The method of manufacturing an insulated gate transistor according to claim 1, wherein said gate electrode and said drain electrode are formed of polycrystalline silicon containing an impurity of the second conductivity type.

3. The method of manufacturing an insulated gate transistor according to claim 1, wherein the semiconductor body is composed of polycrystalline silicon.

4. A method of manufacturing an insulated gate transistor according to claim 1, wherein said gate electrode is formed of a plurality of portions being separated from each other, and wherein said method further comprises the step of forming a region having the same impurity concentration as said second semiconductor region between said plurality of portions.

5. The method of manufacturing an insulated gate transistor comprising a channel region of a first conductivity type and a drain region which includes a first semiconductor region of a second conductivity type and a second semiconductor region of a second conductivity type being in contact with said first semiconductor region and having a lower impurity concentration than said first semiconductor region, the method comprising the steps of:

forming, on an SOI substrate, an insulating film having openings at least at an introducing portion through which an impurity for forming said first semiconductor region is introduced, forming a gate electrode and a drain electrode, each formed by depositing a conductive layer containing an impurity of the second conductivity type, then patterning the deposited conductive layer by etching to form gaps, introducing said impurity of the second conductivity type through said gaps between said gate electrode and said drain electrode to thereby form said second semiconductor region, and introducing said impurity of the second conductivity type from said conductive layer serving as said drain electrode through said impurity introducing portion with heat treatment, to thereby form said first semiconductor region.

6. The method of manufacturing an insulated gate transistor according to claim 5, wherein said method comprises the steps of patterning said conductive layer by photolithography using an excimer laser.

7. A method of manufacturing an insulated gate transistor according to claim 5, wherein said gate electrode is formed of a plurality of portions being separated from each other, and wherein said method further comprises the step of forming a region having the same impurity concentration as said second semiconductor region between said plurality of portions.

\* \* \* \* \*

UNITED STATES PATENT AND TRADEMARK OFFICE
CERTIFICATE OF CORRECTION

PATENT NO. : 5,913,111

DATED : June 15, 1999

INVENTOR(S) : YUZO KATAOKA ET AL.

It is certified that error appears in the above-identified patent and that said Letters Patent is hereby corrected as shown below:

ON THE TITLE PAGE, [54]

TITLE, "INSULAED" should read --INSULATED--.

ON THE TITLE PAGE, [54] References Cited

U.S. PATENT DOCUMENTS, "Ichinoe" should read --Ichinohe-- and "Kadumura" should read --Kadomura--.

COLUMN 1

Line 2, "INSULAED" should read --INSULATED--.

COLUMN 4

Line 37, "Next," should read --¶ Next,--

COLUMN 5

Line 4, "film" should read --film.--.

COLUMN 7

Line 11, "drain the" should read --drain and--;
    Line 15, "surface" should read --surfaces--;
    Line 18, "n-type" should read --$n^-$-type--; and
    Line 38, "oxidation A" should read --oxidation. A--.

UNITED STATES PATENT AND TRADEMARK OFFICE
CERTIFICATE OF CORRECTION

PATENT NO. : 5,913,111

DATED : June 15, 1999

INVENTOR(S) : YUZO KATAOKA ET AL.

It is certified that error appears in the above-identified patent and that said Letters Patent is hereby corrected as shown below:

<u>COLUMN 8</u>

Line 10, "same," should read --same time,--; and
    Line 17, "consisted" should read --consisting--.

<u>COLUMN 9</u>

Line 32, "conductivity" should read --conductivity.--; and
    Line 62, "heat," should read --head,--.

Signed and Sealed this

Seventh Day of March, 2000

Attest:

Attesting Officer

Q. TODD DICKINSON

Commissioner of Patents and Trademarks